(12) United States Patent
Hikichi et al.

(10) Patent No.: US 11,290,097 B2
(45) Date of Patent: Mar. 29, 2022

(54) SEMICONDUCTOR DEVICE

(71) Applicant: ABLIC Inc., Tokyo (JP)

(72) Inventors: Tomoki Hikichi, Tokyo (JP); Kentaro Fukai, Tokyo (JP)

(73) Assignee: ABLIC INC., Tokyo (JP)

( * ) Notice: Subject to any disclaimer, the term of this patent is extended or adjusted under 35 U.S.C. 154(b) by 0 days.

(21) Appl. No.: 17/204,331

(22) Filed: Mar. 17, 2021

(65) Prior Publication Data

US 2021/0297070 A1 Sep. 23, 2021

(30) Foreign Application Priority Data

Mar. 23, 2020 (JP) .............................. JP2020-050895

(51) Int. Cl.
| | |
|---|---|
| *G01R 33/00* | (2006.01) |
| *G01R 33/02* | (2006.01) |
| *G01R 33/07* | (2006.01) |
| *G01L 1/00* | (2006.01) |
| *G01P 15/12* | (2006.01) |
| *H03K 5/24* | (2006.01) |
| *H03F 3/04* | (2006.01) |

(52) U.S. Cl.
CPC ............... *H03K 5/24* (2013.01); *G01R 33/07* (2013.01); *H03F 3/04* (2013.01)

(58) Field of Classification Search
None
See application file for complete search history.

(56) References Cited

U.S. PATENT DOCUMENTS

| | | | |
|---|---|---|---|
| 7,474,093 B2 * | 1/2009 | Ausserlechner | ....... G01R 33/07 324/207.14 |
| 7,980,138 B2 * | 7/2011 | Ausserlechner | ........ H01L 27/22 73/763 |
| 8,723,515 B2 * | 5/2014 | Motz | .................. G01R 33/0029 324/251 |
| 9,322,840 B2 * | 4/2016 | Ausserlechner | ....... G01R 33/07 |
| 10,107,873 B2 * | 10/2018 | Cesaretti | ........... H01L 21/02697 |
| 10,162,017 B2 * | 12/2018 | Cesaretti | ................ G01R 33/07 |
| 10,520,559 B2 * | 12/2019 | Cesaretti | ............ G01R 33/0029 |
| 2005/0162160 A1 | 7/2005 | Ausserlechner et al. | |

* cited by examiner

*Primary Examiner* — Kenneth B Wells
(74) *Attorney, Agent, or Firm* — Crowell & Moring LLP

(57) ABSTRACT

A semiconductor device formed on a semiconductor substrate of a P type includes: a vertical resistor circuit including a resistor of an N type, the resistor forming a current path in a direction perpendicular to a surface of the semiconductor substrate; a Hall element provided on the semiconductor substrate, the Hall element being configured to supply a voltage proportional to a magnetic flux density in the direction perpendicular to the surface of the semiconductor substrate; an amplifier configured to amplify the voltage supplied from the Hall element, and supply the amplified voltage; a current/voltage conversion circuit configured to supply, as a comparison reference voltage, a voltage containing a product of a reference current IREF flowing through the vertical resistor circuit and a resistance value RREF of the vertical resistor circuit; and a comparator configured to receive the voltage supplied from the amplifier and the comparison reference voltage.

9 Claims, 3 Drawing Sheets

SEMICONDUCTOR DEVICE

RELATED APPLICATIONS

This application claims priority to Japanese Patent Application No. 2020-050895, filed on Mar. 23, 2020, the entire content of which is incorporated herein by reference.

BACKGROUND OF THE INVENTION

1. Field of the Invention

The present invention relates to a semiconductor device.

2. Description of the Related Art

A Hall element is integrated together with an amplifier and a signal processing circuit on a semiconductor substrate, and is used, e.g., to detect a magnetic field. Through integration of the Hall element on the semiconductor substrate, a piezoresistive effect occurs due to a mechanical stress (hereinafter simply referred to as "stress") caused by, e.g., a protective film formed on a wafer or resin sealing of a package. If the Hall element is affected by the piezoresistive effect, a relationship between the magnetic field to be detected and a voltage-current conversion coefficient (hereinafter simply referred to as "sensitivity") varies. That is, the sensitivity of the Hall element has stress dependence.

A high stress dependence of the sensitivity of the Hall element reduces accuracy of detecting magnetism. Accordingly, in order to increase the accuracy of detecting magnetism, how to reduce the stress dependence of the sensitivity of the magnetic sensor is important.

An example of a technology of reducing the stress dependence of the sensitivity of the Hall element is a stress compensation circuit including a Hall element, and voltage/current converters (V/I converters) configured to generate electric currents with the use of a plurality of resistors having different piezoelectric coefficients (see U.S. Pat. No. 7,437,260 corresponding to US Patent application Publication No. 2005/162,160, for example). In the stress compensation circuit, the plurality of resistors having different piezoelectric coefficients and the V/I converters are used to generate two different electric currents corresponding to the piezoelectric coefficients of the resistors and the stress. Further, the generated two electric currents are combined to generate one reference current. The generated reference current is used as a drive current for the Hall element.

However, because the stress compensation circuit of the related art described above uses the plurality of resistors having different piezoelectric coefficients, the stress compensation circuit is susceptible to the influence of process manufacturing variations. Further, because the stress compensation circuit of the related art includes a plurality of V/I converters connected to the plurality of resistors, respectively, a circuit scale of the stress compensation circuit tends to be increased. Still further, an increase in size of the circuit also increases current consumption.

SUMMARY OF THE INVENTION

The present invention has been made in view of the above-mentioned circumstances, and therefore has an object to provide a semiconductor device which is less susceptible to the influence of process manufacturing variations, and is capable of reducing a stress dependence of a magnetoelectric conversion characteristic of a Hall element.

According to at least one aspect of the present invention, there is provided a semiconductor device which is formed on a semiconductor substrate of a P type, the semiconductor device including: a vertical resistor circuit including a resistor of an N type, the resistor forming a current path in a direction perpendicular to a surface of the semiconductor substrate; a Hall element provided on the semiconductor substrate, the Hall element being configured to supply a voltage proportional to a magnetic flux density in the direction perpendicular to the surface of the semiconductor substrate; an amplifier configured to amplify the voltage supplied from the Hall element, and supply the amplified voltage; a current/voltage conversion circuit configured to supply, as a reference voltage, a voltage containing a product of a reference current flowing through the vertical resistor circuit and a resistance value of the vertical resistor circuit; and a comparator having a signal input terminal configured to receive the voltage supplied from the amplifier, and a reference voltage input terminal configured to receive the reference voltage.

According to at least one aspect of the present invention, the semiconductor device is less susceptible to the influence of the process manufacturing variations, and is capable of reducing the stress dependence of the magnetoelectric conversion characteristic of the Hall element.

DETAILED DESCRIPTION OF THE PREFERRED EMBODIMENTS

Now, a semiconductor device according to at least one embodiment of the present invention is described with reference to the drawings.

Figure 1:
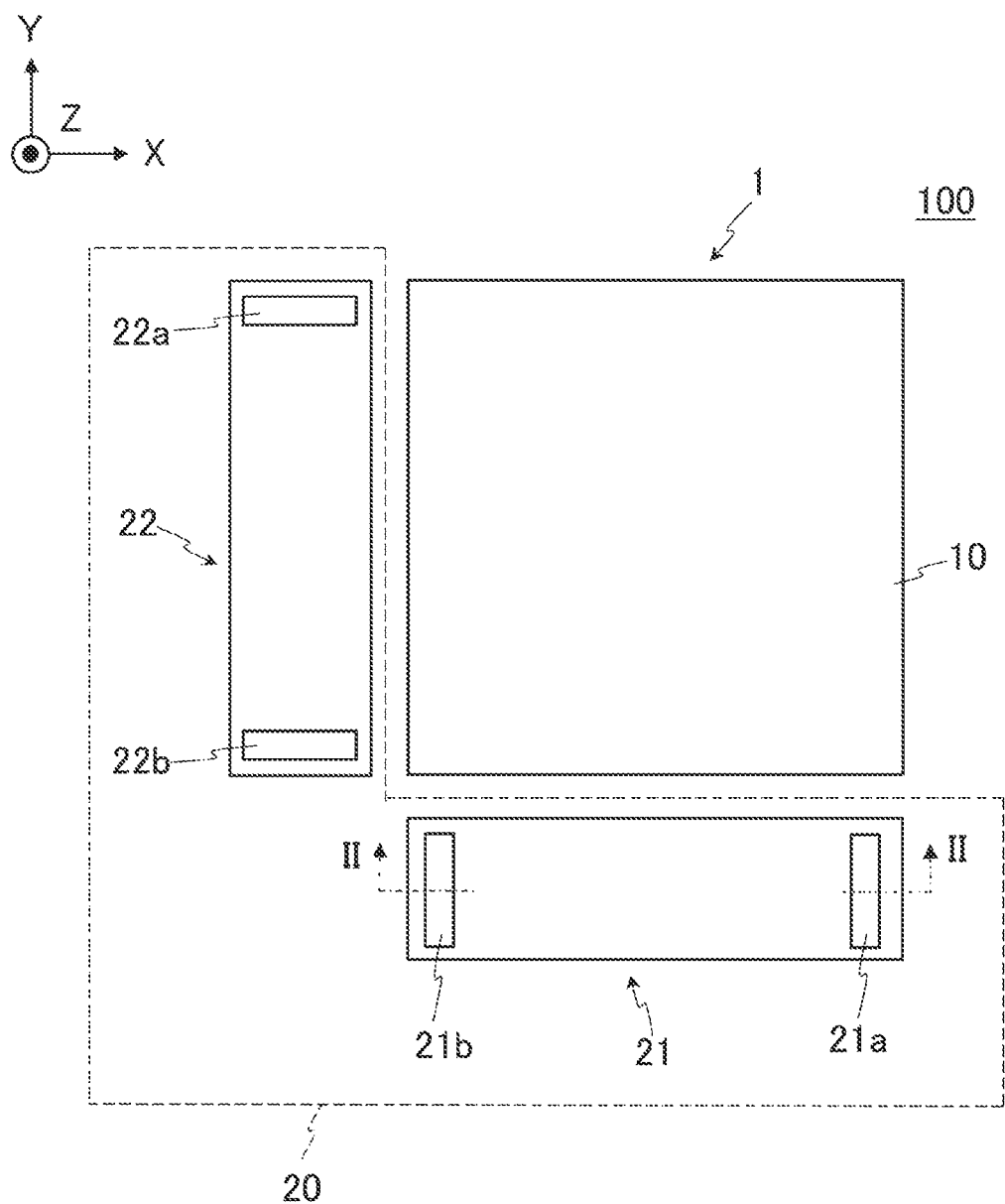
FIG. 1 is a plan view for illustrating a part of a semiconductor device according to at least one embodiment of the present invention.
Figure 2:
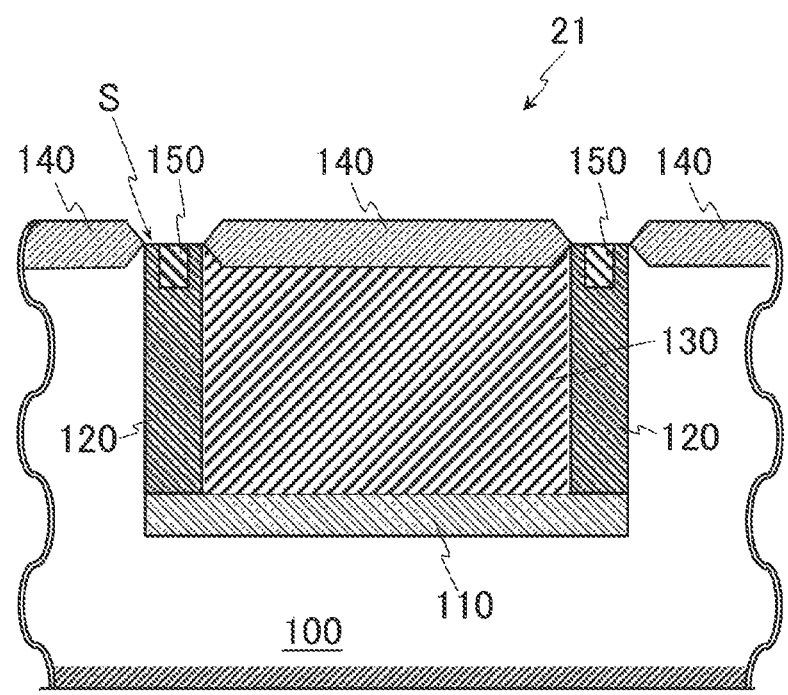
FIG. 2 is a cross-sectional view taken along the line II-II of the semiconductor device according to at least one embodiment.

FIG. 1 is a plan view for illustrating a part of a semiconductor device 1. The semiconductor device 1 is an example of the semiconductor device according to at least one embodiment. FIG. 2 is a cross-sectional view (cross-sectional view taken along the line II-II) for illustrating the semiconductor device 1 in a direction along the line II-II, specifically, a cross section of an X-axis resistor 21. An X axis, a Y axis, and a Z axis illustrated in FIG. 1 and FIG. 2 indicate three axes in an X-Y-Z three-dimensional Cartesian coordinate system.

The semiconductor device 1 is formed on a semiconductor substrate 100 of a P type. The part of the semiconductor device 1 illustrated in FIG. 1 is a part including a Hall element 10 and a vertical resistor circuit 20.

The Hall element 10 is what is called a horizontal Hall element configured to supply a voltage proportional to a magnetic flux density in a Z direction being a direction perpendicular to a surface S of the semiconductor substrate 100.

The vertical resistor circuit 20 is made of a semiconductor of an N type. The vertical resistor circuit 20 includes the X-axis resistor 21 arranged along an X direction as a first direction, and a Y-axis resistor 22 arranged along a Y direction as a second direction.

The X-axis resistor 21 serving as a first resistor includes connection terminals 21a and 21b to be connected to other elements, and a resistor connecting the connection terminal 21a and the connection terminal 21b.

The Y-axis resistor 22 serving as a second resistor is arranged in the direction different from the direction in which the X-axis resistor 21 is arranged, but has substantially the same components as the components of the X-axis resistor 21. In other words, the Y-axis resistor 22 has the same piezoelectric coefficient as a piezoelectric coefficient of the X-axis resistor 21. The Y-axis resistor 22 includes connection terminals 22a and 22b to be connected to other elements, and a resistor connecting the connection terminal 22a and the connection terminal 22b.

FIG. 2 shows that a buried layer 110 of the N type is formed on the semiconductor substrate 100 of the P type. On the buried layer 110 being a region of the N type, epitaxial layers 120 also being regions of the N type are formed. Inside the epitaxial layers 120, a P-well 130 being a region of the P type is formed. In an upper surface of the P-well 130, a LOCal-Oxidation-of-Silicon (LOCOS) layer 140 being an element isolation region is formed. Further, an upper surface of a semiconductor wafer including the semiconductor substrate 100, the buried layer 110, the epitaxial layers 120 including contact areas 150, the P-well 130, and the LOCOS layer 140 is covered by a protective film (not shown).

In upper portions of the epitaxial layers 120, the contact areas 150 being N-type areas having a predetermined depth are formed. In the at least one embodiment, upper surfaces of the epitaxial layers 120 and the contact areas 150 are referred to as "surface S" of the semiconductor substrate 100. The surface S includes the X axis and the Y axis, and is included in a plane having the Z axis as a normal vector, that is, an X-Y plane.

The buried layer 110 and the contact areas 150 are regions having ion concentrations relatively higher than an ion concentration of the epitaxial layers 120. The contact areas 150 correspond to the connection terminals 21a and 21b of the X-axis resistor 21 (see FIG. 1).

The epitaxial layers 120 form a current path in the Z direction being the direction perpendicular to the surface S. The buried layer 110 forms a current path in the X direction being a direction parallel to the surface S to electrically connect the two epitaxial layers 120. The two contact areas 150, the two epitaxial layers 120, and the buried layer 110 form the X-axis resistor 21.

The buried layer 110 has a resistance value being small enough to be ignorable with respect to a resistance value of the epitaxial layers 120. Consequently, in a resistance value of the X-axis resistor 21, the resistance value of the epitaxial layers 120 is dominant.

Figure 3:
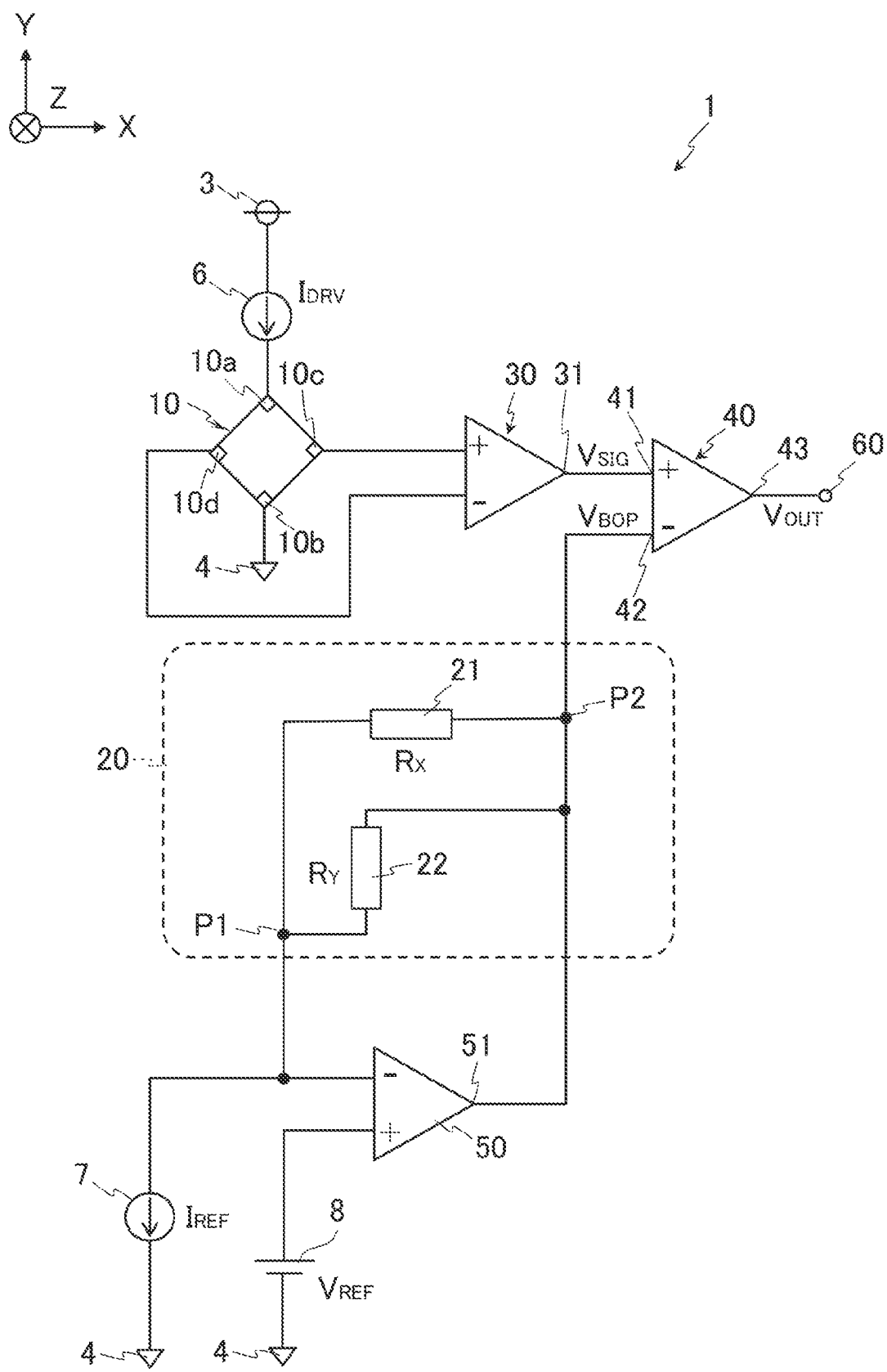
FIG. 3 is a circuit diagram of the semiconductor device according to at least one embodiment.

FIG. 3 is a circuit diagram of the semiconductor device 1.

The semiconductor device 1 includes the Hall element 10, the vertical resistor circuit 20, an amplifier 30, a comparator 40, and a current/voltage conversion circuit (I/V conversion circuit) 50.

The Hall element 10 includes four electrodes 10a to 10d. The amplifier 30 has a non-inverted input terminal (+), an inverted input terminal (−), and an output terminal 31. The comparator 40 has a signal input terminal 41 being a non-inverted input terminal (+), a reference voltage input terminal 42 being an inverted input terminal (−), and an output terminal 43. The current/voltage conversion circuit 50 has a non-inverted input terminal (+), an inverted input terminal (−), and an output terminal 51.

The electrode 10a is connected to a power source 3 via a current source 6 serving as a first current source. Here, the power source 3 is a power source configured to supply a first voltage being a predetermined voltage. The current source 6 has a first end to be connected to the power source 3, and a second end to be connected to the electrode 10a, and is configured to supply a drive current $I_{DRV}$ to the Hall element 10. The electrode 10b is connected to a power source 4. The power source 4 is configured to supply a second voltage lower than the first voltage.

The electrodes 10a and 10b through which the drive current $I_{DRV}$ flows are drive electrodes of the Hall element 10. The remaining two electrodes 10c and 10d are output electrodes from which a differential voltage is supplied. The electrode 10c and the electrode 10d are connected to the non-inverted input terminal (+) and the inverted input terminal (−) of the amplifier 30, respectively. The output terminal 31 is connected to the signal input terminal 41.

Meanwhile, the reference voltage input terminal 42 is connected to the output terminal 51 of the current/voltage conversion circuit 50. The vertical resistor circuit 20 being a feedback circuit is connected between the output terminal 51 and the inverted input terminal (−) of the current/voltage conversion circuit 50.

The vertical resistor circuit 20 has a nodal point P1 being a first end and a nodal point P2 being a second end. The X-axis resistor 21 and the Y-axis resistor 22 are connected between the nodal point P1 and the nodal point P2. FIG. 3 shows that the X-axis resistor 21 and the Y-axis resistor 22 are connected in parallel to form the vertical resistor circuit 20. In other words, the nodal point P1 is a connection point of one ends of the X-axis resistor 21 and the Y-axis resistor 22 in the vertical resistor circuit 20. The nodal point P2 is a connection point of the other ends of the X-axis resistor 21 and the Y-axis resistor 22 in the vertical resistor circuit 20.

To describe the nodal point P1 and the nodal point P2 in relation to the X-axis resistor 21, the nodal point P1 corresponds to the connection terminal 21a illustrated in FIG. 1 and one contact area 150 illustrated in FIG. 2, for example. The nodal point P2 corresponds to the connection terminal 21b illustrated in FIG. 1 and the other contact area 150 illustrated in FIG. 2, for example.

The nodal point P1 is connected to a first end of a current source 7, as well as to the one ends of the X-axis resistor 21 and the Y-axis resistor 22 and the inverted input terminal (−) of the current/voltage conversion circuit 50 described above.

The current source 7 serving as a second current source has the first end to be connected to the first end of the vertical resistor circuit 20 and the inverted input terminal (−) of the current/voltage conversion circuit 50, and a second end to be connected to the power source 4. The current source 7 is configured to supply a reference current $I_{REF}$ to flow through the vertical resistor circuit 20.

The non-inverted input terminal (+) of the current/voltage conversion circuit 50 is connected to the power source 4 via a reference voltage circuit 8. The reference voltage circuit 8 has a first end to be connected to the non-inverted input terminal (+) of the current/voltage conversion circuit 50, and a second end to be connected to the power source 4, and is configured to supply a reference voltage $V_{REF}$ of the current/voltage conversion circuit 50.

In the semiconductor device 1 configured as described above, the drive current $I_{DRV}$ flows between the electrodes 10a and 10b. Upon detecting the magnetic flux density orthogonal to the surface S of the semiconductor substrate 100 by the Hall element 10, the Hall element 10 supplies a voltage proportional to the detected magnetic flux density from the electrodes 10c and 10d to the amplifier 30.

The amplifier 30 is a differential input amplifier, and the voltage supplied from the electrodes 10c and 10d is received by the non-inverted input terminal (+) and the inverted input terminal (−), respectively. The voltage received by the non-inverted input terminal (+) and the inverted input terminal (−) is amplified by the amplifier 30, and the amplified voltage is supplied from the output terminal 31. A signal voltage $V_{SIG}$ supplied from the output terminal 31 is received by the signal input terminal 41.

Meanwhile, the reference voltage input terminal 42 receives an operating point voltage $V_{BOP}$ as a comparison reference voltage. The operating point voltage $V_{BOP}$ is a voltage containing a product of the reference current $I_{REF}$ flowing through the vertical resistor circuit 20 and a resistance value $R_{REF}$ of the vertical resistor circuit 20. Specifically, the operating point voltage $V_{BOP}$ is a sum of the product of the reference current $I_{REF}$ and the resistance value $R_{REF}$, and the reference voltage $V_{REF}$.

The comparator 40 is configured to compare the signal voltage $V_{SIG}$ received by the signal input terminal 41 and the operating point voltage $V_{BOP}$ received by the reference voltage input terminal 42, and supply an output voltage $V_{OUT}$ at a high level or a low level depending on whether the signal voltage $V_{SIG}$ is higher than the operating point voltage $V_{BOP}$, from the output terminal 43 to an output terminal 60. The output voltage $V_{OUT}$ supplied to the output terminal 60 is supplied to an external circuit (not shown) connected to the output terminal 60.

Subsequently, description is given of a ratio of change (hereinafter referred to as "stress-dependent coefficient") of a magnetoelectric conversion coefficient of the entire semiconductor device 1 with respect to a stress.

A magnetoelectric conversion coefficient $K_H$ of the Hall element 10 formed in the X-Y plane is expressed by the following expression (1).

$$K_H = S_I \cdot I_{DRV} \quad (1)$$
$$= S_{IREF}[1 + \pi_H(\sigma_{XX} + \sigma_{YY})] \cdot I_{DRV}$$

$S_I$: magnetoelectric conversion coefficient per unit drive current
$I_{DRV}$: drive current of the Hall element 10
$S_{IREF}$: magnetoelectric conversion coefficient per unit drive current under a reference stress
$\pi_H$: piezoelectric coefficient for an axial stress in the X-Y plane of the magnetoelectric conversion coefficient per unit drive current
$\sigma_{XX}$: vertical stress in the X direction
$\sigma_{YY}$: vertical stress in the Y direction
$\sigma_{XX}+\sigma_{YY}$: isotropic stress in the X-Y plane The "reference stress" as used herein refers to a stress that acts on a semiconductor chip including the semiconductor device 1 under a predetermined state. Further, the "predetermined state" refers to an identifiable state, e.g., a state after formation of the protective film covering the upper surfaces.

Further, with the output voltage of the Hall element 10 being represented by a voltage $V_H$, and an amplification factor of the amplifier 30 being represented by G, the signal voltage $V_{SIG}$ received by the signal input terminal 41 is expressed by the following expression (2). Further, with the use of the above-mentioned expression (1), the signal voltage $V_{SIG}$ is expressed by the following expression (3). The following expression (3) shows that the signal voltage $V_{SIG}$ has a stress dependence.

$$V_{SIG} = G \cdot V_H \quad (2)$$
$$= G \cdot S_I \cdot I_{DRV} \cdot B_{in}$$
$$= G \cdot S_{IREF}[1 + \pi_H(\sigma_{XX} + \sigma_{YY})] \cdot I_{DRV} \cdot B_{in} \quad (3)$$

$B_{in}$: magnetic flux density applied in the Z direction

In the example of the Hall element 10 described above, a stress-dependent coefficient of the signal voltage $V_{SIG}$ supplied from the Hall element 10 to the signal input terminal 41 is calculated to be +44%/GPa. Here, a positive stress-dependent coefficient indicates that the stress is a tensile stress. Further, a negative stress-dependent coefficient indicates that the stress is a compressive stress.

Meanwhile, the operating point voltage $V_{BOP}$ supplied from the current/voltage conversion circuit 50 to the reference voltage input terminal 42 is expressed by the following expression (4). The following expression (4) shows that the operating point voltage $V_{BOP}$ has a stress dependence.

$$V_{BOP} = V_{REF} + R \cdot I_{REF} \quad (4)$$
$$= V_{REF} + R_{REF}[1 + \pi_{12}(\sigma_{XX} + \sigma_{YY})] \cdot I_{REF}$$

$V_{BOP}$: operating point voltage
$V_{REF}$: reference voltage of the current/voltage conversion circuit 50
R: combined resistance value of the vertical resistor circuit 20$I_{REF}$: reference current
$R_{REF}$: combined resistance value of the vertical resistor circuit 20 under the reference stress
$\pi_{12}$: piezoelectric coefficient for the axial stress in the X-Y plane of a resistance value in the Z direction of the vertical resistor circuit 20

In the example of the vertical resistor circuit 20 described above, a stress-dependent coefficient of the operating point voltage $V_{BOP}$ is calculated to be +53%/GPa.

Further, a stress-dependent coefficient of the output voltage $V_{OUT}$ is −9%/GPa obtained as a difference between +44%/GPa being the stress-dependent coefficient of the signal voltage $V_{SIG}$ received by the signal input terminal 41 and +53%/GPa being the stress-dependent coefficient of the operating point voltage $V_{BOP}$ received by the reference voltage input terminal 42. In this specification, a semiconductor device in which the reference voltage circuit 8 is directly connected to the reference voltage input terminal 42 is referred to as "semiconductor device without stress compensation."

Comparing the stress-dependent coefficient of the output voltage $V_{OUT}$ between the semiconductor device 1 and the semiconductor device without stress compensation, the stress-dependent coefficient of the output voltage $V_{OUT}$ is opposite in stress direction to the stress-dependent coefficient of the signal voltage $V_{SIG}$ being an output voltage of the semiconductor device without stress compensation. It is also shown that an absolute value (=9%/GPa) of the stress-dependent coefficient of the output voltage $V_{OUT}$ is suppressed to about ⅕ of an absolute value (=44%/GPa) of the stress-dependent coefficient of the signal voltage $V_{SIG}$.

According to the at least one embodiment, in order to compensate for a stress dependence of the magnetoelectric conversion coefficient of the entire semiconductor device 1, the operating point voltage $V_{BOP}$ is used. The operating point voltage $V_{BOP}$ is generated with the use of the X-axis resistor 21 and the Y-axis resistor 22 including resistors having the same piezoelectric coefficient. Consequently, in the at least one embodiment, the influence of process manufacturing variations can be reduced as compared to the case of using a resistor including a plurality of resistors having different piezoelectric coefficients.

According to the at least one embodiment, a compensation signal for reducing the stress dependence of the magnetoelectric conversion coefficient of the entire semiconductor device 1, that is, the operating point voltage $V_{BOP}$, can be generated with the use of a single current/voltage conversion circuit 50. In contrast, in a stress compensation circuit using the resistor including the plurality of resistors having different piezoelectric coefficients, a compensation signal is generated with the use of a plurality of V/I converters. Consequently, in the at least one embodiment, as compared to the case of using the resistor including the plurality of resistors having different piezoelectric coefficients, increases in a circuit scale and current consumption can be suppressed.

According to the at least one embodiment, the stress-dependent coefficient of the magnetoelectric conversion coefficient of the entire semiconductor device 1 can be suppressed in absolute value to about ⅕ of the stress-dependent coefficient of the magnetoelectric conversion coefficient of the entire semiconductor device to which the operating point voltage $V_{BOP}$ generated with the use of the X-axis resistor 21 and the Y-axis resistor 22 is not applied.

According to the at least one embodiment, in generating the operating point voltage $V_{BOP}$ being the compensation signal, a stress dependence is not added to current consumption of the semiconductor device 1. This is advantageous in terms of operational stability of the semiconductor device as compared to the stress compensation circuit of the related art in which the stress dependence is added to current consumption in generating the compensation signal.

With the drive current of the Hall element and the current consumption of the semiconductor device having the stress dependence as in the stress compensation circuit described in U.S. Pat. No. 7,437,260, the current consumption varies under the influence of a stress applied on the semiconductor substrate. With the varying current consumption, operations based on the current consumption of the semiconductor device, e.g., control operation and monitoring operation, become unstable. In other words, an erroneous operation and false detection are prone to occur. In contrast, in the semiconductor device 1, because the current consumption is not affected by the stress applied on the semiconductor substrate, the current consumption does not vary even with a variation in stress applied on the semiconductor substrate. Consequently, the operation based on the current consumption of the semiconductor device 1 is stable.

The present invention is not limited to the above-described at least one embodiment, and can be carried out in various forms in addition to the examples described above in the stage of carrying out the invention, and various omissions, replacements, and alterations may be made thereto without departing from the gist of the invention.

For example, the current source 7 may include a current mirror circuit configured to supply, as the reference current $I_{REF}$, a current obtained by copying the drive current $I_{DRV}$ at a predetermined current ratio. In this example, with a current ratio being represented by a, the reference current $I_{REF}$ is generated so as to satisfy $I_{REF}=\alpha I_{DRV}$. In a case in which $I_{REF}=\alpha I_{DRV}$ is satisfied, a magnetic operating point $B_{OP}$ can be approximated as in the following expression (5).

$$B_{OP} \approx (\alpha R_{REF}/G \cdot S_{IREF})[1+(\pi_{12}-\pi_H)(\sigma_{XX}+\sigma_{YY})] \quad (5)$$

The right side of the above-mentioned expression (5) is a product of the current ratio α and a design constant. Consequently, the magnetic operating point $B_{OP}$ is not dependent on the reference current, and even with the reference current having the stress dependence and temperature dependence, the influence on the magnetic operating point $B_{OP}$ can be eliminated. Further, in a case in which the magnetic operating point $B_{OP}$ is to be adjusted, if only the current ratio α being the design constant is set at predetermined value, the magnetic operating point $B_{OP}$ can be changed easily.

The semiconductor device 1 described above is an example in which the vertical resistor circuit 20, the Hall element 10, the amplifier 30, the current/voltage conversion circuit 50, and the comparator 40 are formed on the semiconductor substrate 100, but the semiconductor device 1 is not limited thereto. In the semiconductor device 1, components other than the Hall element 10 and the vertical resistor circuit 20 may be formed on another semiconductor substrate than the semiconductor substrate 100.

Further, the vertical resistor circuit 20 illustrated in FIG. 3 is an example in which the X-axis resistor 21 and the Y-axis resistor 22 are connected in parallel to form the vertical resistor circuit 20, but the present invention is not limited thereto. The vertical resistor circuit 20 may be formed by connecting the X-axis resistor 21 and the Y-axis resistor 22 in series, for example. That is, the vertical resistor circuit 20 is only configured by connecting the X-axis resistor 21 and the Y-axis resistor 22.

The above-mentioned embodiments and modifications thereof are encompassed by the scope and gist of the invention, and by the invention defined in the appended claims and equivalents thereof.

What is claimed is:

1. A semiconductor device which is formed on a semiconductor substrate of a P type, the semiconductor device comprising:
   a vertical resistor circuit including a resistor of an N type, the resistor forming a current path in a direction perpendicular to a surface of the semiconductor substrate;
   a Hall element provided on the semiconductor substrate, the Hall element being configured to supply a voltage proportional to a magnetic flux density in the direction perpendicular to the surface of the semiconductor substrate;
   an amplifier configured to amplify the voltage supplied from the Hall element, and supply the amplified voltage;
   a current/voltage conversion circuit configured to supply, as a comparison reference voltage, a voltage containing a product of a reference current flowing through the vertical resistor circuit and a resistance value of the vertical resistor circuit; and
   a comparator having a signal input terminal configured to receive the voltage supplied from the amplifier, and a reference voltage input terminal configured to receive the comparison reference voltage.

2. The semiconductor device according to claim 1, further comprising:
   a first current source configured to supply a drive current for driving the Hall element; and a second current source configured to supply the reference current.

3. The semiconductor device according to claim 2, wherein the second current source includes a current mirror circuit configured to copy the drive current at a predetermined current ratio, and supply the copied drive current as the reference current.

4. The semiconductor device according to claim 1, further comprising:
  a current source configured to supply a drive current for driving the Hall element; and
  a current mirror circuit configured to copy the drive current at a predetermined current ratio, and supply the copied drive current as the reference current.

5. The semiconductor device according to claim 1, wherein the vertical resistor circuit includes:
  a first resistor arranged along a first direction parallel to the surface of the semiconductor substrate; and
  a second resistor arranged along a second direction, the second resistor having the same piezoelectric coefficient as a piezoelectric coefficient of the first resistor, the second direction being parallel to the surface of the semiconductor substrate and perpendicular to the first direction,
    the first resistor and the second resistor being electrically connected to form the vertical resistor circuit.

6. The semiconductor device according to claim 5, further comprising:
  a first current source configured to supply a drive current for driving the Hall element; and
  a second current source configured to supply the reference current.

7. The semiconductor device according to claim 6, wherein the second current source includes a current mirror circuit configured to copy the drive current at a predetermined current ratio, and supply the copied drive current as the reference current.

8. The semiconductor device according to claim 4, further comprising:
  a first current source configured to supply a drive current for driving the Hall element; and
  a current mirror circuit configured to copy the drive current at a predetermined current ratio, and supply the copied drive current as the reference current.

9. The semiconductor device according to claim 1, further comprising a current source circuit configured to supply a drive current for driving the Hall element and the reference current,
  wherein the current source circuit includes a current source configured to supply the drive current, and a current mirror circuit configured to supply the reference current generated by copying the drive current at a predetermined current ratio.

* * * * *